United States Patent
Zhang et al.

(10) Patent No.: US 12,405,496 B2
(45) Date of Patent: Sep. 2, 2025

(54) COLOR FILTER, METHOD FOR FABRICATING SAME, AND DISPLAY PANEL

(71) Applicant: Guangzhou China Star Optoelectronics Semiconductor Display Technology Co., Ltd., Guangzhou (CN)

(72) Inventors: Yuxiu Zhang, Guangzhou (CN); Hailong Wen, Guangzhou (CN)

(73) Assignee: Guangzhou China Star Optoelectronics Semiconductor Display Technology Co., Ltd., Guangzhou (CN)

( * ) Notice: Subject to any disclaimer, the term of this patent is extended or adjusted under 35 U.S.C. 154(b) by 0 days.

(21) Appl. No.: 17/785,082

(22) PCT Filed: Jun. 8, 2022

(86) PCT No.: PCT/CN2022/097707
§ 371 (c)(1),
(2) Date: Jun. 14, 2022

(87) PCT Pub. No.: WO2023/221201
PCT Pub. Date: Nov. 23, 2023

(65) Prior Publication Data
US 2024/0192542 A1    Jun. 13, 2024

(30) Foreign Application Priority Data
May 17, 2022    (CN) .......................... 202210536117.6

(51) Int. Cl.
*G02F 1/1335* (2006.01)
*G03F 7/00* (2006.01)

(52) U.S. Cl.
CPC .. *G02F 1/133516* (2013.01); *G02F 1/133512* (2013.01); *G03F 7/0007* (2013.01)

(58) Field of Classification Search
CPC ......... G02F 1/133516; G02F 1/133512; G03F 7/0007
See application file for complete search history.

(56) References Cited

U.S. PATENT DOCUMENTS

2015/0331316 A1*  11/2015  Choi ..................... C09B 67/009
                                                        252/586
2019/0319058 A1*  10/2019  Imoto ................. H01L 27/1464

FOREIGN PATENT DOCUMENTS

| CN | 1576990 A | 2/2005 |
|---|---|---|
| CN | 102736310 A | 10/2012 |

(Continued)

OTHER PUBLICATIONS

English machine translation of JPH-09265086-A (Oct. 1997) (Year: 1997).*

(Continued)

*Primary Examiner* — Jonathan Johnson
*Assistant Examiner* — Jayson D Cosgrove
(74) *Attorney, Agent, or Firm* — Nathan & Associates Patent Agents Ltd.; Menachem Nathan

(57) ABSTRACT

A method for fabricating a color filter includes: providing a substrate; forming a first photoresist material layer on the substrate; patterning the first photoresist material layer to form a plurality of first photoresists; forming a second photoresist material layer on the first photoresists and the substrate, wherein the second photoresist material layer comprises a plurality of dye molecules; and patterning the second photoresist material layer to form a plurality of second photoresists. The patterning the first photoresist material layer to form the first photoresists includes: controlling curing process parameters of the first photoresists to increase a density of the first photoresists, thereby preventing the dye molecules from entering the first photoresists.

15 Claims, 6 Drawing Sheets

(56) References Cited

FOREIGN PATENT DOCUMENTS

| CN | 106842686 A | 6/2017 |
| CN | 110488405 A | 11/2019 |
| JP | H-09265086 A * | 10/1997 |
| JP | 2001235614 A | 8/2001 |

OTHER PUBLICATIONS

International Search Report in International application No. PCT/CN2022/097707, mailed on Dec. 20, 2022.
Written Opinion of the International Search Authority in International application No. PCT/CN2022/097707, mailed on Dec. 20, 2022.

* cited by examiner

COLOR FILTER, METHOD FOR FABRICATING SAME, AND DISPLAY PANEL

FIELD OF INVENTION

The present disclosure relates to the technical field of display, and particularly to a color filter, a method for fabricating the same, and a display panel.

BACKGROUND

With change of liquid crystal display devices, the liquid crystal display devices are gradually developing in a direction of high resolution, wide color gamut, high screen ratio, thin and light, and energy saving. In order to achieve low power consumption and a wide color gamut, a mixture of dye and pigment or a dye is added to filter photoresists. However, due to addition of dye molecules with smaller particle sizes, photoresists of different colors will be dyed with each other. Specifically, after a first photoresist is cured, if a second photoresist comprising dye molecules is formed, the dye molecules will easily diffuse and penetrate a surface of the first photoresist, so that the dye molecules remain on the surface of the first photoresist after the second photoresist is developed, thereby reducing transmittance of the first photoresist.

SUMMARY OF DISCLOSURE

The present disclosure provides a color filter, a method for fabricating the same, and a display panel to solve a technical problem that photoresists of different colors in a current color filter are dyed with each other, resulting in a decrease in transmittance of the dyed photoresists.

In order to solve the above technical problem, the present disclosure provides the following technical solutions.

The present disclosure provides a method for fabricating a color filter, comprising: providing a substrate;
  forming a first photoresist material layer on the substrate;
  patterning the first photoresist material layer to form a plurality of first photoresists;
  forming a second photoresist material layer on the first photoresists and the substrate, wherein the second photoresist material layer comprises a plurality of dye molecules; and
  patterning the second photoresist material layer to form a plurality of second photoresists;
  wherein the patterning the first photoresist material layer to form the first photoresists comprises:
controlling curing process parameters of the first photoresists to increase a density of the first photoresists, thereby preventing the dye molecules from entering the first photoresists.

In an embodiment, the controlling the curing process parameters of the first photoresists comprises:
  providing a first mask;
  photo-curing the first photoresist material layer from a side of the first mask away from the substrate;
  developing the photo-cured first photoresist material layer; and
  heat-curing the developed first photoresist material layer to form the first photoresists;
wherein one or more of an exposure energy value of the photo-curing, a temperature of the heat-curing, and a time of the heat-curing are increased to increase the density of the first photoresists, thereby preventing the dye molecules from entering the first photoresists.

In an embodiment, the exposure energy value is 40 mJ/cm$^2$ to 90 mJ/cm$^2$, the temperature of the heat-curing is 230° ° C. to 350° C., and the time of the heat-curing is 20 minutes to 90 minutes.

In an embodiment, the patterning the second photoresist material layer to form the second photoresists comprises:
  providing a second mask;
  photo-curing the second photoresist material layer from a side of the second mask away from the substrate;
  developing the photo-cured second photoresist material layer; and
  heat-curing the developed second photoresist material layer to form the second photoresists.

In an embodiment, the first photoresists comprise the same dye molecules as the second photoresists.

In an embodiment, the dye molecules have a particle size of 1 nm to 3 nm.

In an embodiment, each of the first photoresists comprises a first photoresist portion disposed on a side of the substrate, and a second photoresist portion disposed on a side of the first photoresist portion away from the substrate. A density of the second photoresist portion is greater than a density of the first photoresist portion, so as to prevent the dye molecules from entering the first photoresists.

In an embodiment, each of the first photoresists comprises a first photoresist portion disposed on a side of the substrate, and a third photoresist portion covering the substrate and the first photoresist portion. A density of the third photoresist portion is greater than a density of the first photoresist portion, so as to prevent the dye molecules from entering the first photoresists.

In an embodiment, before forming the second photoresists or before forming the first photoresists, the method for fabricating the color filter further comprises:
  forming a plurality of third photoresists, which comprises:
    controlling curing process parameters of the third photoresists to increase a density of the third photoresists, thereby preventing the dye molecules from entering the third photoresists.

In an embodiment, before forming the first photoresists and the second photoresists, the method for fabricating the color filter further comprises:
  forming a black matrix material layer on the substrate; and
  patterning the black matrix material layer to form a plurality of black matrices spaced apart from each other;
  wherein each of the first photoresists, the second photoresists, and the third photoresists is formed between at least two adjacent black matrices.

In an embodiment, one of the first photoresist, the second photoresist, and the third photoresist is one of a red photoresist, a green photoresist, and a blue photoresist, and the first photoresist, the second photoresist, and the third photoresist have different colors.

The present disclosure further provides a color filter comprising a plurality of first photoresists and a plurality of second photoresists. The second photoresists comprise a plurality of dye molecules. A density of the first photoresists is greater than a predetermined value, thereby preventing the dye molecules from entering the first photoresists.

In an embodiment, each of the first photoresists comprises a first photoresist portion disposed on a side of the substrate, and a second photoresist portion disposed on a side of the first photoresist portion away from the substrate. A density of the second photoresist portion is greater than a density of the first photoresist portion, so as to prevent the dye molecules from entering the first photoresists.

In an embodiment, each of the first photoresists comprises a first photoresist portion disposed on a side of the substrate, and a third photoresist portion covering the substrate and the first photoresist portion. A density of the third photoresist portion is greater than a density of the first photoresist portion, so as to prevent the dye molecules from entering the first photoresists.

In an embodiment, the first photoresists comprise the same dye molecules as the second photoresists.

In an embodiment, the dye molecules have a particle size of 1 nm to 3 nm.

In an embodiment, the color filter further comprises a plurality of third photoresists. One of the first photoresist, the second photoresist, and the third photoresist is one of a red photoresist, a green photoresist, and a blue photoresist. The first photoresist, the second photoresist, and the third photoresist have different colors.

In an embodiment, the color filter further comprises a plurality of black matrices. Each of the first photoresists, the second photoresists, and the third photoresists is formed between at least two adjacent black matrices.

The present disclosure further provides a display panel comprising a color filter, an array substrate, and a liquid crystal layer. The color filter comprises a plurality of first photoresists and a plurality of second photoresists. The second photoresists comprise a plurality of dye molecules. A density of the first photoresists is greater than a predetermined value, thereby preventing the dye molecules from entering the first photoresists. The array substrate is disposed opposite to the color filter. The liquid crystal layer is disposed between the array substrate and the color filter.

In an embodiment, each of the first photoresists comprises a first photoresist portion disposed on a side of the substrate, and a second photoresist portion disposed on a side of the first photoresist portion away from the substrate. A density of the second photoresist portion is greater than a density of the first photoresist portion, so as to prevent the dye molecules from entering the first photoresists.

Beneficial effects of the present invention are as follows. In the color filter, the method for fabricating the same, and the display panel provided by the present disclosure, by controlling process parameters of curing processes for forming the first photoresists, the density of the cured first photoresists is increased. Therefore, when the second photoresists are subsequently formed, the dye molecules in the second photoresists are not easy to diffuse and penetrate surfaces of the first photoresists. Accordingly, after the second photoresists are developed, the dye molecules will not remain on the surfaces of the first photoresists, which avoids a decrease in transmittance of the first photoresists. This is beneficial to solve a problem of mutual dyeing of photoresists of different colors.

BRIEF DESCRIPTION OF DRAWINGS

In order to more clearly illustrate technical solutions in embodiments of the present disclosure or the prior art, a brief description of accompanying drawings used in a description of the embodiments of the present disclosure or the prior art will be given below. Obviously, the accompanying drawings in the following description are merely some embodiments of the present disclosure. For those skilled in the art, other drawings may be obtained from these accompanying drawings without creative labor.

DETAILED DESCRIPTION

Figure 1:
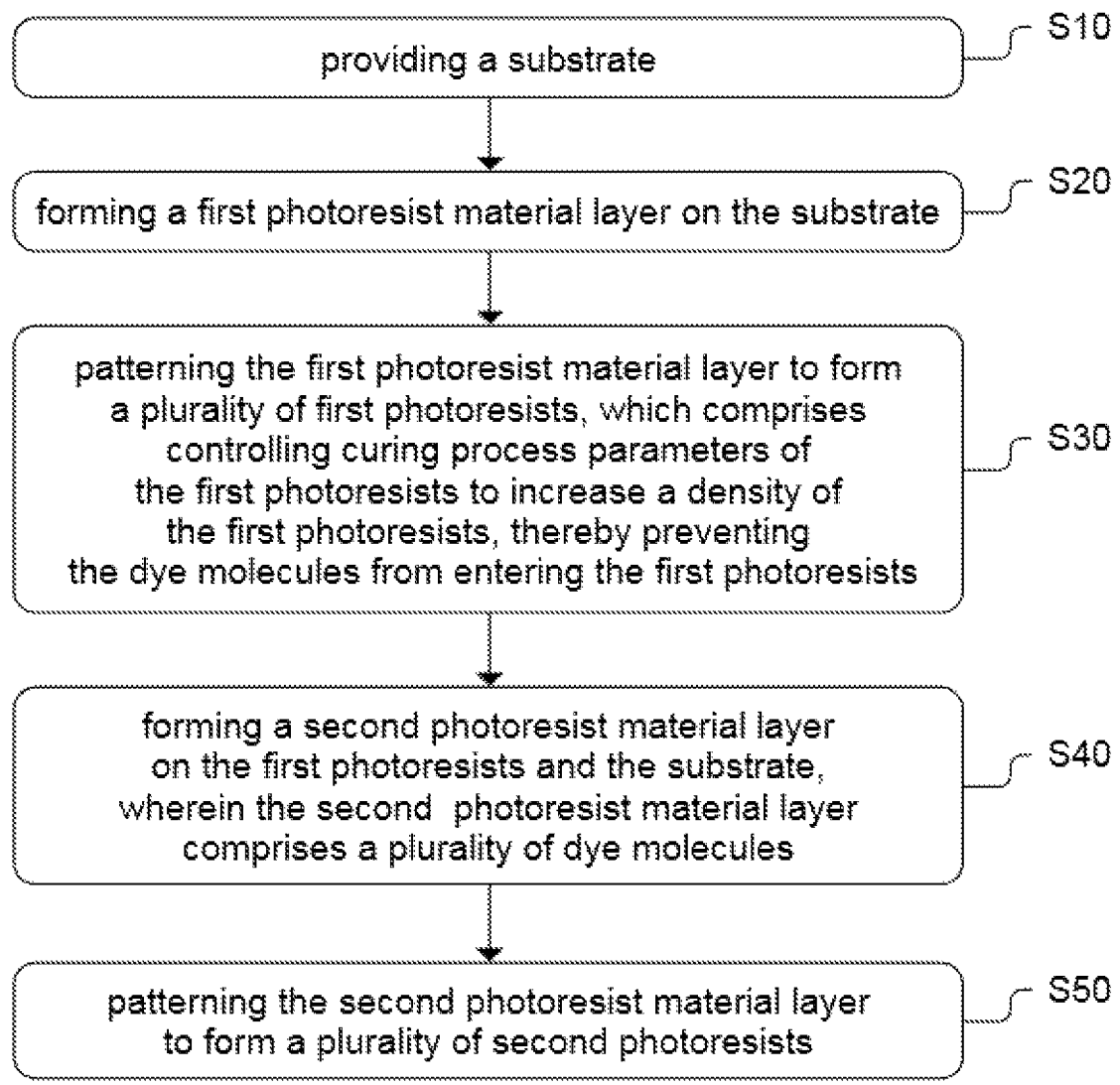
FIG. 1 is a flow chart of a method for fabricating a color filter according to an embodiment of the present disclosure.
Figure 2A:
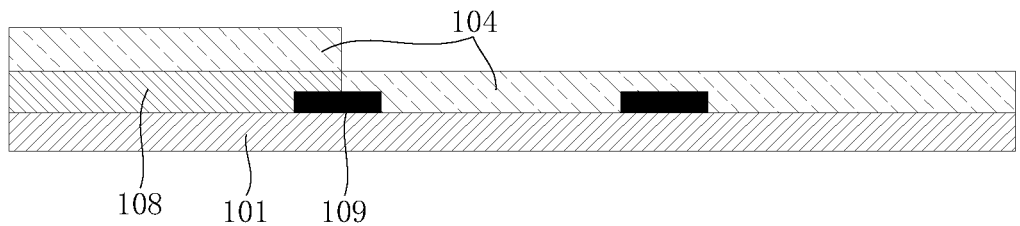
FIG. 2A to FIG. 2F are schematic flow charts of the method for fabricating the color filter according to an embodiment of the present disclosure.
Figure 2B:
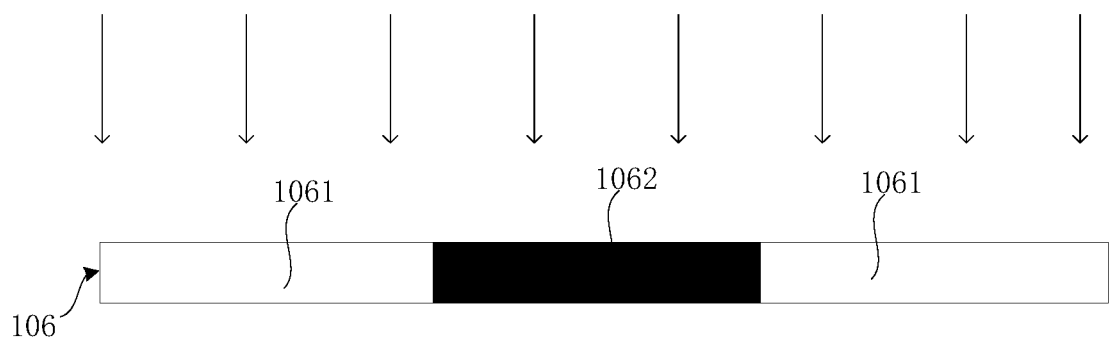
Figure 2C:
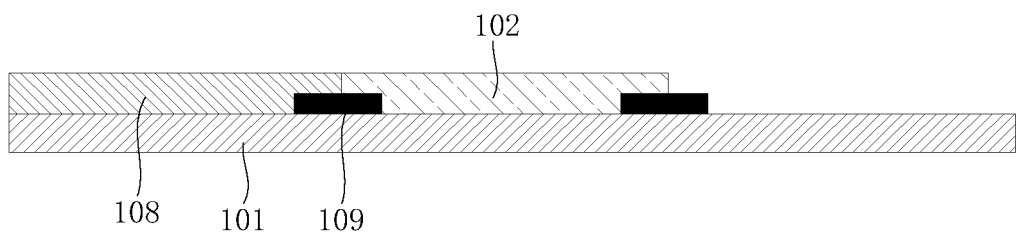
Figure 2D:
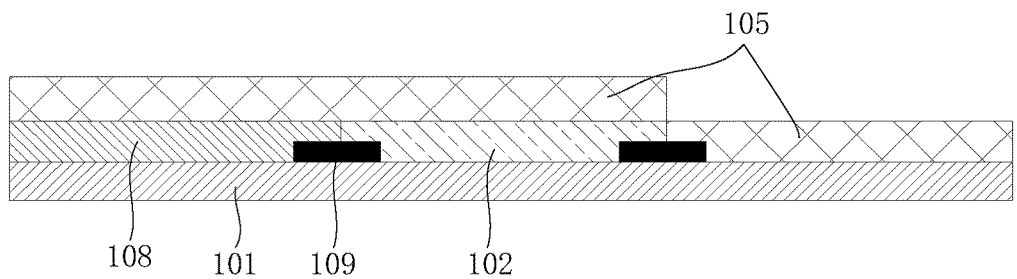
Figure 2E:
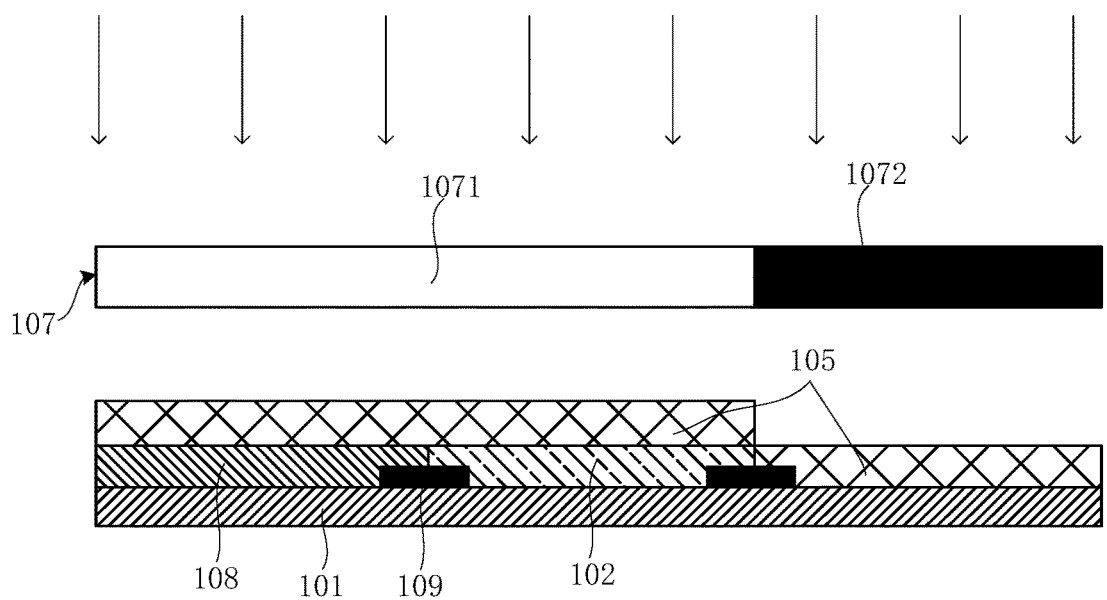
Figure 2F:
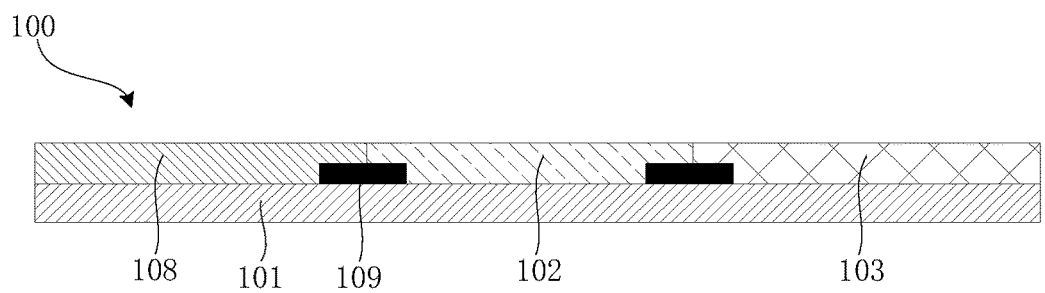

Technical solutions in embodiments of the present disclosure will be clearly and completely described below in conjunction with accompanying drawings in the embodiments of the present disclosure. It is apparent that the described embodiments are merely a part of the embodiments of the present disclosure and not all embodiments. All other embodiments obtained by those skilled in the art based on the embodiments of the present disclosure without creative labor are within claimed scope of the present disclosure. In addition, it should be understood that specific embodiments described herein are only used to illustrate and explain the present invention, and are not used to limit the present invention. In the present disclosure, unless otherwise stated, directional terms used herein specifically indicate directions of the accompanying drawings. For example, directional terms "upper" and "lower" generally refer to upper and lower positions of a device in actual use or working conditions, and directional terms "inside" and "outside" refer to positions relative to a profile of the device.

In the prior art, a second photoresist is formed after a first photoresist is formed. Because the second photoresist contains dye molecules, in a process of forming the second photoresist, the dye molecules will easily diffuse and penetrate a surface of the first photoresist. As a result, after the second photoresist is developed, the dye molecules remain on the surface of the first photoresist, thereby reducing transmittance of the first photoresist and affecting product quality.

Specifically, please refer to Table 1, the inventor experimentally verifies the aforementioned phenomenon. Taking a green photoresist G as the first photoresist and a blue photoresist B as the second photoresist as an example, the inventor analyzes experimental data and finds that if the blue photoresist B contains dye molecules, after the green photoresist G is formed, transmittance Y1 of the green photoresist G (transmittance of G after G is formed) is 59.050. After the blue photoresist B is formed, transmittance Y2 of the green photoresist G (transmittance of G after B is formed) is 57.610. The two values are subtracted to obtain ΔY (the transmittance of G after B is formed−the transmittance of G after G is formed) of −1.440. If the blue photoresist B does not contain dye molecules, after the green photoresist G is formed, the transmittance Y1 of the green photoresist G (the transmittance of G after G is formed) is 59.305. After the blue photoresist B is formed, the transmittance Y2 of the green photoresist G (the transmittance of G after B is formed) is 59.096. The two values are subtracted to obtain ΔY (the transmittance of G after B is formed−the transmittance of G after G is formed) of −0.209.

As can be seen from the foregoing description, compared with the case where the blue photoresist B does not contain dye molecules, when the blue photoresist B contains dye molecules, the transmittance of the green photoresist G decreases significantly after the blue photoresist B is formed. Accordingly, when the dye molecules in the blue photoresist B diffuse to a surface of the green photoresist G, the transmittance of the green photoresist G is affected.

TABLE 1

| Photoresist | Y1 (transmittance of G after G is formed) | Y2 (transmittance of G after B is formed) | ΔY (chromaticity of G after B is formed − the transmittance of G after G is formed) |
|---|---|---|---|
| Blue photoresist B containing dye molecules | 59.050 | 57.610 | −1.440 |
| Blue photoresist B without dye molecules | 59.305 | 59.096 | −0.209 |

In view of this, in order to solve the aforementioned technical problem, the present disclosure provides a method for fabricating a color filter. Please refer to FIG. 1 and FIG. 2A to FIG. 2F. FIG. 1 is a flow chart of a method for fabricating a color filter according to an embodiment of the present disclosure. FIG. 2A to FIG. 2F are schematic flow charts of the method for fabricating the color filter according to an embodiment of the present disclosure. The method comprises the following steps.

Step S10: providing a substrate 101.
Step S20: forming a first photoresist material layer 104 on the substrate 101.
Step S30: patterning the first photoresist material layer 104 to form a plurality of first photoresists 102.
Step S40: forming a second photoresist material layer 105 on the first photoresists 102 and the substrate 101, wherein the second photoresist material layer 105 comprises a plurality of dye molecules.
Step S50: patterning the second photoresist material layer 105 to form a plurality of second photoresists 103.

The patterning the first photoresist material layer 104 to form the first photoresists 102 comprises: controlling curing process parameters of the first photoresists 102 to increase a density of the first photoresists 102, thereby preventing the dye molecules from entering the first photoresists 102.

It can be understood that a density of a photoresist is related to curing processes for forming the photoresist. In the present invention, by controlling process parameters of curing processes for forming the first photoresists 102, the density of the cured first photoresists 102 is increased. Therefore, when the second photoresists 103 are subsequently formed, the dye molecules in the second photoresists 103 are not easy to diffuse and penetrate surfaces of the first photoresists 102. Accordingly, after the second photoresists 103 are developed, the dye molecules will not remain on the surfaces of the first photoresists 102, which avoids a decrease in transmittance of the first photoresists 102. This is beneficial to solve a problem of mutual dyeing of photoresists of different colors.

A process of forming of the first photoresists 102 comprises the following steps. A first photoresist material solution is poured and spin-coated onto the substrate 101 to form the first photoresist material layer 104. After that, the substrate 101 with the first photoresist material layer 104 is pre-baked. After that, a first mask 106 is placed on a side of the first photoresist material layer 104 away from the substrate 101. The first mask 106 is a patterned mask. The first mask 106 comprises a first light-transmitting region 1061 and a first light-shielding region 1062. The first light-shielding region 1062 corresponds to a region where the first photoresists 102 to be formed are located. The first light-transmitting region 1061 corresponds to a region other than the region where the first photoresists 102 to be formed are located. Then, a device with a high-pressure mercury lamp is placed on a side of the first mask 106 away from the substrate 101, and the device with the high-pressure mercury lamp exposes the first photoresist material layer 104 with light having a preset exposure energy value. The light is emitted to a surface of the first photoresist material layer 104 through the first light-transmitting region 1061. After that, the first photoresist material layer 104 is developed with an etchant at a preset temperature, rinsed with deionized water, and purged with nitrogen, to obtain a patterned first photoresist material layer 104. After that, moisture on the surface of the first photoresist material layer 104 is removed, and the substrate 101 with the patterned first photoresist material layer 104 is placed in a convection oven and baked at a preset curing temperature for a certain period of time, thereby obtaining the first photoresists 102.

Furthermore, the patterning the second photoresist material layer 105 to form the second photoresists 103 comprises:
providing a second mask 107;
photo-curing the second photoresist material layer 105 from a side of the second mask 107 away from the substrate 101;
developing the photo-cured second photoresist material layer 105; and
heat-curing the developed second photoresist material layer 105 to form the second photoresists 103.

A process of forming of the second photoresists 103 comprises the following steps. A second photoresist material solution is poured and spin-coated onto the substrate 101 and the first photoresists 102 to form the second photoresist material layer 105. The second photoresist material layer 105 covers the first photoresists 102 and the substrate 101. After that, the substrate 101 with the first photoresists 102 and the second photoresist material layer 105 is pre-baked. After that, a second mask 107 is placed on a side of the second photoresist material layer 105 away from the substrate 101. The second mask 107 is a patterned mask. The second mask 107 comprises a second light-transmitting region 1071 and a second light-shielding region 1072. The second light-shielding region 1072 corresponds to a region where the second photoresists 103 to be formed are located. The second light-transmitting region 1071 corresponds to a region other than the region where the second photoresists 103 to be formed are located. Then, a device with a high-pressure mercury lamp is placed on a side of the second mask 107 away from the substrate 101, and the device with the high-pressure mercury lamp exposes the second photoresist material layer 105 with light having a preset exposure energy value. The light is emitted to a surface of the second photoresist material layer 105 through the second light-transmitting region 1071. After that, the second photoresist material layer 105 is developed with an etchant at a preset temperature, rinsed with deionized water, and purged with nitrogen, to obtain a patterned second photoresist material layer 105. After that, moisture on the surface of the second photoresist material layer 105 is removed, and the substrate 101 with the patterned second photoresist material layer 105 is placed in a convection oven and baked at a preset curing temperature for a certain period of time, thereby obtaining the second photoresists 103.

Specifically, the substrate 101 may be a rigid substrate or a flexible substrate. In this embodiment, the substrate is a glass substrate.

It should be noted that in order to further realize low power consumption and wide color gamut, the first photoresists 102 in this embodiment may also comprise dye molecules, and the dye molecules in the first photoresists 102 may be the same as the dye molecules in the second photoresists 103.

Specifically, the dye molecules have a particle size of 1 nm to 3 nm.

It should be noted that a density of a photoresist is related to curing processes for forming the photoresist. Specifically, the curing processes for forming the photoresist comprise a photo-curing process and a heat-curing process. Photo-curing refers to: in an exposure process, under light, photoinitiators quickly form free radicals or ionic active groups, which cross-link monomers to form cross-linked polymers with certain molecular weights. Heat-curing refers to: in a baking process, at high temperature, the cross-linked polymers with the certain molecular weights are further cross-linked to form cross-linked polymers with large molecular weights, and a remaining solvent therein is volatilized, thereby forming a dense filter layer. That is, photo-curing of the photoresist exists during an exposure process of a photoresist material layer, and heat-curing of the photoresist exists during a baking process of the patterned photoresist material layer.

It can be seen from the above analysis that in this embodiment, the density of the first photoresists 102 is increased by controlling the process parameters of the curing processes for forming the first photoresists 102. Specifically, in this embodiment, the density of the first photoresists 102 is increased by controlling process parameters of a photo-curing process and a heat-curing process for forming the first photoresists 102, so that the dye molecules in the second photoresists 103 are not easy to diffuse and penetrate surfaces of the first photoresists 102, thereby avoiding a decrease in the transmittance of the first photoresists 102.

Furthermore, the process parameters of the photo-curing process comprise exposure energy value and the like, and the process parameters of the heat-curing process comprise heat-curing temperature and heat-curing time. The exposure energy value, heat-curing temperature, and heat-curing time are positively correlated with the density of the photoresist, and these parameters are easily regulated in actual processes. Therefore, in the present invention, the density of the first photoresists 102 is increased by increasing the exposure energy value of the photo-curing process and/or increasing the heat-curing temperature and/or the heat-curing time of the heat-curing process.

Specifically, several methods for increasing the density of the first photoresists 102 mentioned above will be described in detail below.

Comparative Example

First, the inventor gives a comparative example. In Comparative Example, it is also taken as an example that the first photoresists 102 are green photoresists G and the second photoresists 103 are blue photoresists B. A specific formation process of the first photoresists 102 in Comparative Example comprises the following steps. 3 mL of a green photoresist material solution is poured and spin-coated onto a 10×10 cm$^2$ glass substrate to form a green photoresist material layer. After that, the glass substrate is placed on a hot plate at 90° C. and pre-baked by heating for 90 seconds. Then, the green photoresist material layer is exposed with light having an exposure energy value of 40 mJ/cm$^2$ by using a device with a high pressure mercury lamp and a first mask, developed with a 0.04 wt % KOH aqueous solution at 23° C., rinsed with deionized water, and purged with nitrogen, so as to obtain the patterned green photoresist material layer. After that, surface moisture is removed, and the glass substrate with the patterned green photoresist material layer is baked in a convection oven at 230° C. for 20 minutes to form a plurality of green photoresists G, thereby obtaining an optical filter with the green photoresists G.

A formation process of the second photoresists 103 in Comparative Example formation process specifically comprises the following steps. 3 mL of a blue photoresist material solution is poured and spin-coated onto the 10×10 cm$^2$ optical filter with the green photoresists G to form a blue photoresist material layer. After that, the glass substrate is placed on a hot plate at 90° C. and pre-baked by heating for 90 seconds. Then, the blue photoresist material layer is exposed with light having an exposure energy value of 40 mJ/cm$^2$ by using the device with the high pressure mercury lamp and a second mask, developed with a 0.04 wt % KOH aqueous solution at 23° C., rinsed with deionized water, and purged with nitrogen, so as to obtain the patterned blue photoresist material layer. After that, surface moisture is removed, and the glass substrate with the patterned blue photoresist material layer is baked in a convection oven at 230° C. for 20 minutes to form a plurality of blue photoresists B, thereby obtaining an optical filter with the blue photoresists G and the blue photoresists B.

Similarly, the inventor experimentally verifies Examples 1 to 3 in the present disclosure. In order to reduce experimental deviation, in Examples 1 to 3, it is also taken as an example that the first photoresists 102 are green photoresists G and the second photoresists 103 are blue photoresists B.

Example 1

A step of controlling curing process parameters of the first photoresists 102 comprises:
providing the first mask 106;
photo-curing the first photoresist material layer 104 from the side of the first mask 106 away from the substrate 101;
developing the photo-cured first photoresist material layer 104; and
heat-curing the developed first photoresist material layer 104 to form the first photoresists 102;
wherein the photo-curing the first photoresist material layer 104 comprises: adjusting an exposure energy value of the photo-curing to increase the density of the first photoresists 102 to a level capable of blocking the dye molecules from entering the first photoresists 102.

Steps and process parameters of a formation process of the first photoresists 102 in Example 1 are same as steps and process parameters of the formation process of the first photoresists 102 in Comparative Example. The only difference is that an exposure energy value of the first photoresist material layer 104 (i.e. the green photoresist material layer) in Example 1 is increased from 40 mJ/cm$^2$ in Comparative Example to 70 mJ/cm$^2$. Specifically, the first photoresist material layer 104 is exposed with light having an exposure energy value of 70 mJ/cm$^2$ by using a device with a high pressure mercury lamp and the first mask 106.

In addition, a formation process and process parameters of the second photoresists 103 in Example 1 are completely same as the formation process and the process parameters of the second photoresists 103 in Comparative Example.

Figure 3:
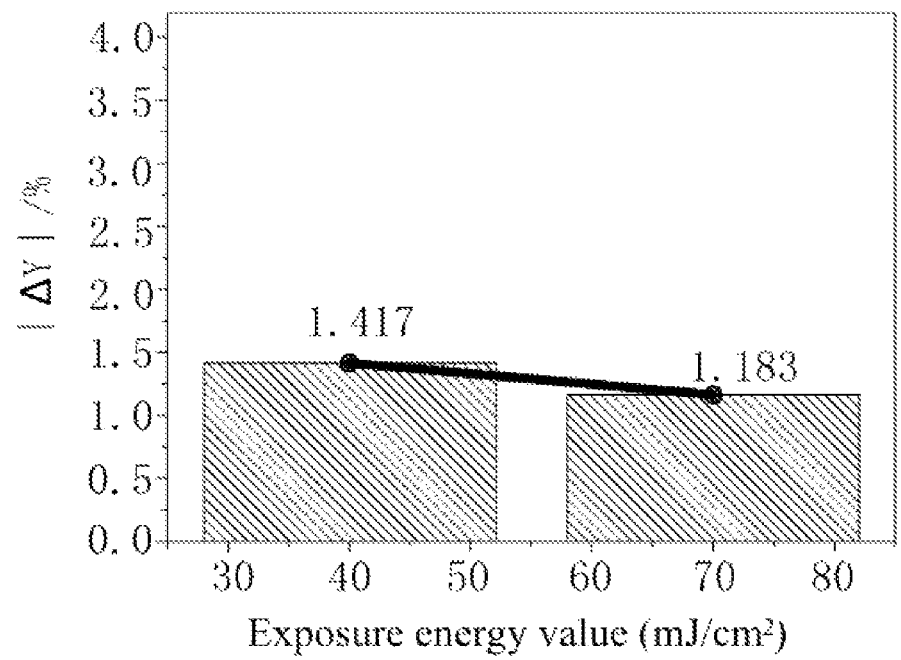
FIG. 3 is a schematic diagram of a relationship of exposure energy value and transmittance according to an embodiment of the present disclosure.

Specifically, please refer to FIG. 3 and Table 2 for experimental results. FIG. 3 is a schematic diagram of a relationship of exposure energy value and transmittance according to an embodiment of the present disclosure. The inventor analyzes the experimental results and finds that in Comparative Example, after the green photoresists G are formed, transmittance Y1 of the green photoresists G (transmittance of G after G is formed) is 59.008. After the blue photoresists B are formed, transmittance Y2 of the green photoresists G (transmittance of G after B is formed) is 57.591. The two values are subtracted to obtain ΔY (the transmittance of G after B is formed–the transmittance of G after G is formed) of –1.417. In contrast, in Example 1, after the green photoresists G are formed, the transmittance Y1 of the green photoresists G (the transmittance of G after G is formed) is 61.192. After the blue photoresists B are formed, the transmittance Y2 of the green photoresists G (the transmittance of G after B is formed) is 60.008. The two values are subtracted to obtain ΔY (the transmittance of G after B is formed–the transmittance of G after G is formed) of –1.183.

It can be seen from the foregoing that in Example 1, a surface density of the green photoresists G is increased by increasing the exposure energy value, which can prevent the dye molecules in the blue photoresists B from diffusing to the surfaces of the green photoresists G, thereby avoiding the decrease of the transmittance of the green photoresists G.

TABLE 2

| Exposure energy value of G dose/mj | Y1 (transmittance of G after G is formed) | Y2 (transmittance of G after B is formed) | ΔY (chromaticity of G after B is formed – the transmittance of G after G is formed) |
| --- | --- | --- | --- |
| 40 | 59.008 | 57.591 | –1.417 |
| 70 | 61.192 | 60.008 | –1.183 |

Example 2

The step of controlling the curing process parameters of the first photoresists 102 comprises:
providing the first mask 106;
photo-curing the first photoresist material layer 104 from the side of the first mask 106 away from the substrate 101;
developing the photo-cured first photoresist material layer 104; and
heat-curing the developed first photoresist material layer 104 to form the first photoresists 102;
wherein the heat-curing the developed first photoresist material layer 104 comprises:
increasing a heat-curing temperature to increase the density of the first photoresists 102 to a level capable of blocking the dye molecules from entering the first photoresists 102.

Steps and process parameters of a formation process of the first photoresists 102 in Example 2 are same as steps and process parameters of the formation process of the first photoresists 102 in Comparative Example. The only difference is that a heat-curing temperature of the first photoresist material layer 104 (i.e. the green photoresist material layer) in Example 2 is increased from the heat-curing temperature of 230° C. in Comparative Example to 250° C. Specifically, the substrate 101 with the patterned first photoresist material layer 104 is baked in a convection oven at 250° C. for 20 minutes.

In addition, a formation process and process parameters of the second photoresists 103 in Example 2 are completely same as the formation process and the process parameters of the second photoresists 103 in Comparative Example.

Figure 4:
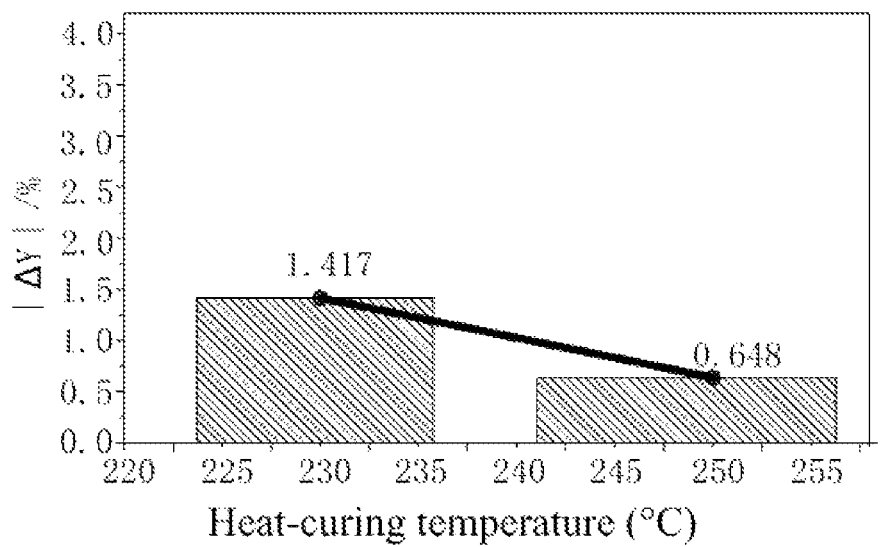
FIG. 4 is a schematic diagram of a relationship of heat-curing temperature and transmittance according to an embodiment of the present disclosure.

Specifically, please refer to FIG. 4 and Table 3 for experimental results. FIG. 4 is a schematic diagram of a relationship of heat-curing temperature and transmittance according to an embodiment of the present disclosure. The inventor analyzes the experimental results and finds that in Comparative Example, after the green photoresists G are formed, the transmittance Y1 of the green photoresists G (the transmittance of G after G is formed) is 59.008. After the blue photoresists B are formed, the transmittance Y2 of the green photoresists G (the transmittance of G after B is formed) is 57.591. The two values are subtracted to obtain ΔY (the transmittance of G after B is formed–the transmittance of G after G is formed) of –1.417. In contrast, in Example 2, after the green photoresists G are formed, the transmittance Y1 of the green photoresists G (the transmittance of G after G is formed) is 58.655. After the blue photoresists B are formed, the transmittance Y2 of the green photoresists G (the transmittance of G after B is formed) is 58.008. The two values are subtracted to obtain ΔY (the transmittance of G after B is formed–the transmittance of G after G is formed) of –0.648.

It can be seen from the foregoing that in Example 2, the surface density of the green photoresists G is increased by increasing the heat-curing temperature, which can prevent the dye molecules in the blue photoresists B from diffusing to the surfaces of the green photoresists G, thereby avoiding the decrease of the transmittance of the green photoresists G.

In addition, it can be understood that the value of ΔY in Example 2 is less than the value of ΔY in Example 1, that is, the solution provided in Example 2 is more effective in improving the transmittance than the solution provided in Example 1. Generally, the value of ΔY is controlled to be less than 0.7%, which is better for improving the transmittance.

TABLE 3

| Heat-curing temperature T/° C. | Y1 (transmittance of G after G is formed) | Y2 (transmittance of G after B is formed) | ΔY (chromaticity of G after B is formed – the transmittance of G after G is formed) |
| --- | --- | --- | --- |
| 230 | 59.008 | 57.591 | –1.417 |
| 250 | 58.655 | 58.008 | –0.648 |

Example 3

The step of controlling the curing process parameters of the first photoresists 102 comprises:
providing the first mask 106;
photo-curing the first photoresist material layer 104 from the side of the first mask 106 away from the substrate 101;

developing the photo-cured first photoresist material layer 104; and heat-curing the developed first photoresist material layer 104 to form the first photoresists 102;

wherein the heat-curing the developed first photoresist material layer 104 comprises: increasing a heat-curing time to increase the density of the first photoresists 102 to a level capable of blocking the dye molecules from entering the first photoresists 102.

Steps and process parameters of a formation process of the first photoresists 102 in Example 3 are same as steps and process parameters of the formation process of the first photoresists 102 in Comparative Example. The only difference is that a heat-curing time of the first photoresist material layer 104 (i.e. the green photoresist material layer) in Example 3 is increased from the heat-curing time of 20 minutes in Comparative Example to 40 minutes. Specifically, the substrate 101 with the patterned first photoresist material layer 104 is baked in a convection oven at 230° C. for 40 minutes.

In addition, a formation process and process parameters of the second photoresists 103 in Example 3 are completely same as the formation process and the process parameters of the second photoresists 103 in Comparative Example.

Figure 5:
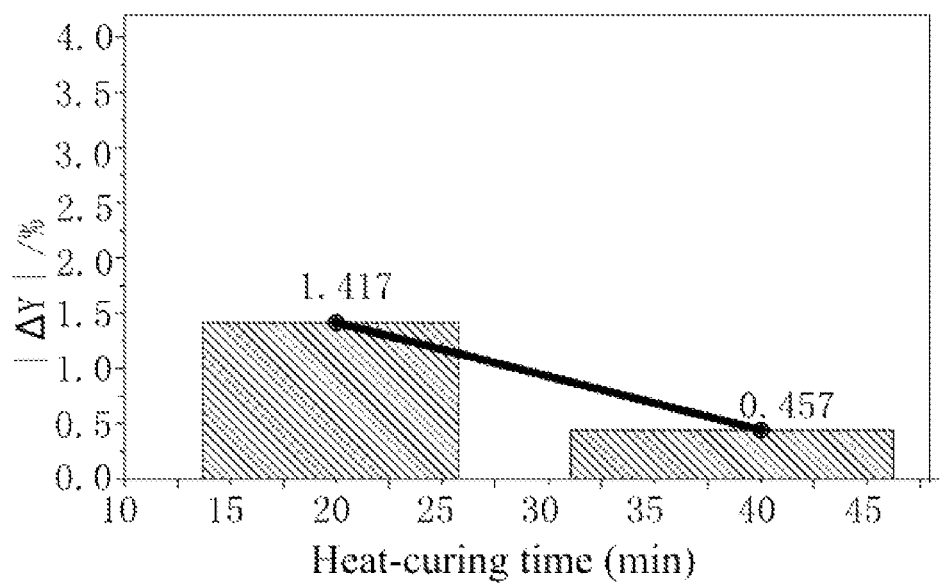
FIG. 5 is a schematic diagram of a relationship of heat-curing time and transmittance according to an embodiment of the present disclosure.

Specifically, please refer to FIG. 5 and Table 4 for experimental results. FIG. 5 is a schematic diagram of a relationship of heat-curing time and transmittance according to an embodiment of the present disclosure. The inventor analyzes the experimental results and finds that in Comparative Example, after the green photoresists G are formed, the transmittance Y1 of the green photoresists G (the transmittance of G after G is formed) is 59.008. After the blue photoresists B are formed, the transmittance Y2 of the green photoresists G (the transmittance of G after B is formed) is 57.591. The two values are subtracted to obtain ΔY (the transmittance of G after B is formed–the transmittance of G after G is formed) of −1.417. In contrast, in Example 3, after the green photoresists G are formed, the transmittance Y1 of the green photoresists G (the transmittance of G after G is formed) is 58.544. After the blue photoresists B are formed, the transmittance Y2 of the green photoresists G (the transmittance of G after B is formed) is 58.087. The two values are subtracted to obtain ΔY (the transmittance of G after B is formed–the transmittance of G after G is formed) of −0.457.

It can be seen from the foregoing that in Example 3, the surface density of the green photoresists G is increased by increasing the heat-curing time, which can prevent the dye molecules in the blue photoresists B from diffusing to the surfaces of the green photoresists G, thereby avoiding the decrease of the transmittance of the green photoresists G.

In addition, it can be understood that the value of ΔY in Example 3 is less than the value of ΔY in Example 1, that is, the solution provided in Example 3 is more effective in improving the transmittance than the solution provided in Example 1.

TABLE 4

| Heat-curing time t/min | Y1 (transmittance of G after G is formed) | Y2 (transmittance of G after B is formed) | ΔY (chromaticity of G after B is formed − the transmittance of G after G is formed) |
| --- | --- | --- | --- |
| 20 | 59.008 | 57.591 | −1.417 |
| 40 | 58.544 | 58.087 | −0.457 |

Furthermore, before forming the second photoresists 103 or before forming the first photoresists 102, the method for fabricating the color filter 100 further comprises: forming a plurality of third photoresists 108. In the step of forming the plurality of third photoresists 108, curing process parameters of the third photoresists 108 are controlled to increase a density of the third photoresists 108 to a level capable of blocking the dye molecules from entering the third photoresists 108.

It can be understood that the color filter 100 generally comprises photoresists of at least three colors, namely, the first photoresists 102, the second photoresists 103, and the third photoresist 108. If the second photoresists 103 are formed after the first photoresists 102 and the third photoresists 108 are formed, the second photoresist material layer 105 covers the first photoresists 102 and the third photoresists 108, so the dye molecules in the second photoresists 103 also easily diffuse into the third photoresists 108. As a result, transmittance of the third photoresists 108 is decreased.

Therefore, in this embodiment, process parameters of curing processes for forming the third photoresists 108 are controlled to increase a density of the third photoresist 108, thereby preventing the dye molecules in the second photoresists 103 from easily diffusing into the third photoresists 108. A formation process of the third photoresists 108 is similar to the formation process of the second photoresists 103 and the formation process of the first photoresists 102, and will not be described in detail herein. For details, reference may be made to the above related description.

Specifically, the exposure energy value is 40 mJ/cm$^2$ to 90 mJ/cm$^2$, the heat-curing temperature is 230° C. to 350° C., and the heat-curing time is 20 minutes to 90 minutes.

Furthermore, the color filter 100 further comprises a plurality of black matrices 109 for shading. Accordingly, before forming the first photoresists 102 and the second photoresists 103, the method further comprises:

forming a black matrix material layer on the substrate 101; and patterning the black matrix material layer to form the black matrices 109 spaced apart from each other;

wherein each of the first photoresists 102, the second photoresists 103, and the third photoresists 108 is formed between at least two adjacent black matrices 109.

Specifically, one of the first photoresist 102, the second photoresist 103, and the third photoresist 108 is one of a red photoresist, a green photoresist, and a blue photoresist. The first photoresist 102, the second photoresist 103, and the third photoresist 108 have different colors.

Figure 6:
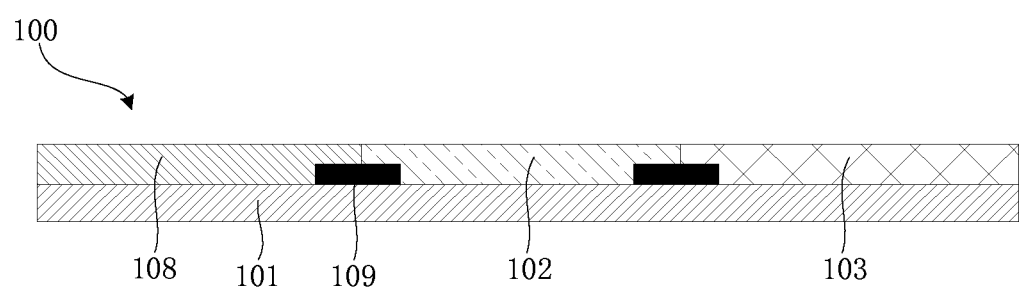
FIG. 6 is a schematic cross-sectional structural diagram of a color filter according to an embodiment of the present disclosure.

Please refer to FIG. 6, which is a schematic cross-sectional structural diagram of a color filter according to an embodiment of the present disclosure. The present disclosure further provides a color filter 100. The color filter 100 comprises a plurality of first photoresists 102 and a plurality of second photoresists 103. The second photoresists 103 comprise a plurality of dye molecules. A density of the first photoresists 102 is greater than a predetermined value, thereby preventing the dye molecules from entering the first photoresists 102.

Figure 7A:
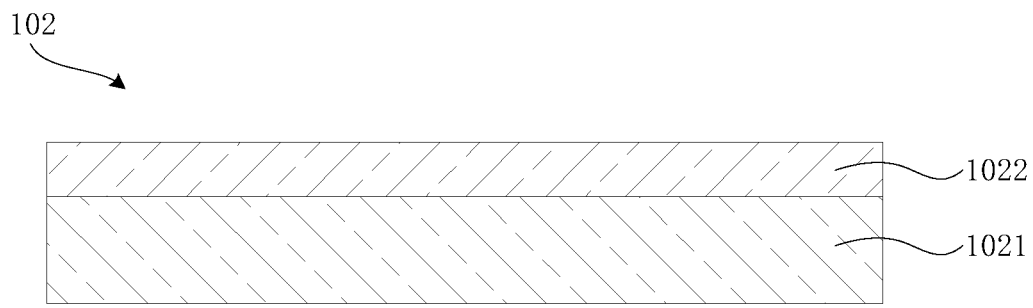
FIG. 7A is a schematic cross-sectional structure diagram of a first photoresist according to an embodiment of the present disclosure.

Please refer to FIG. 7A, which is a schematic cross-sectional structure diagram of a first photoresist according to an embodiment of the present disclosure. In an embodiment, the first photoresist 102 comprises a first photoresist portion 1021 and a second photoresist portion 1022. The first photoresist portion 1021 is disposed on a side of the substrate, and the second photoresist portion 1022 is disposed on a side of the first photoresist portion 1021 away from the substrate 101. A density of the second photoresist portion 1022 is greater than a density of the first photoresist portion 1021, so as to prevent the dye molecules from entering the first photoresist 102.

It can be understood that because an upper surface of the first photoresist 102 is in contact with a lower surface of the second photoresist material layer 105, the dye molecules in the second photoresist 103 easily diffuse to the upper surface of the first photoresist 102. Therefore, a density of the upper surface of the first photoresist 102 (i.e. the second photoresist portion 1022) may be increased, and a density of a rest of the first photoresist 102 (i.e. the first photoresist portion 1021) remains unchanged.

Figure 7B:
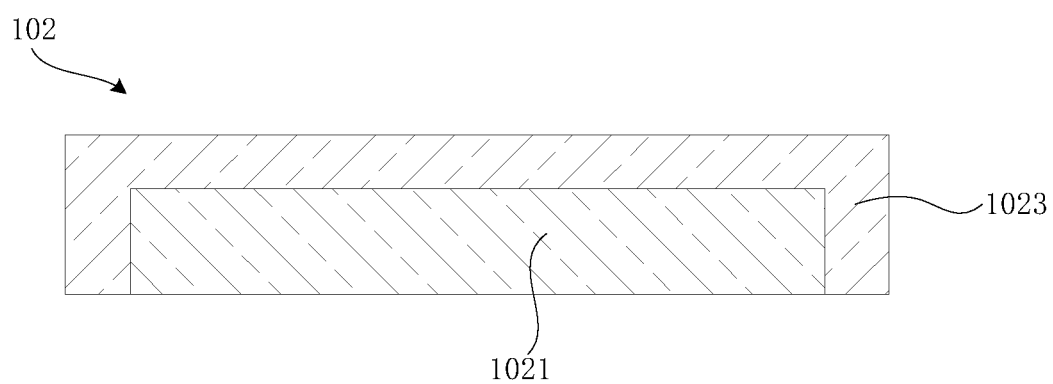
FIG. 7B is another schematic cross-sectional structure diagram of a first photoresist according to an embodiment of the present disclosure.

Furthermore, please refer to FIG. 7B, which is another schematic cross-sectional structure diagram of a first photoresist according to an embodiment of the present disclosure. In an embodiment, the first photoresist 102 comprises a first photoresist portion 1021 and a third photoresist portion 1023. The first photoresist portion 1021 is disposed on a side of the substrate, and the third photoresist portion 1023 covers the substrate 101 and the first photoresist portion 1021. A density of the third photoresist portion 1023 is greater than a density of the first photoresist portion 1021, so as to prevent the dye molecules from entering the first photoresist 102.

It can be understood that because the second photoresist 103 is disposed adjacent to the first photoresist 102, and a side surface of the second photoresist 103 close to the first photoresist 102 is in contact with a side surface of the first photoresist 102 close to the second photoresist 103, the dye molecules in the second photoresist 103 easily diffuse to the side surface of the first photoresist 102. Therefore, a density of an outer surface of the first photoresist 102 (i.e. the third photoresist portion 1023) may be increased, and a density of a rest of the first photoresist 102 (i.e. the first photoresist portion 1021) remains unchanged.

Figure 8:
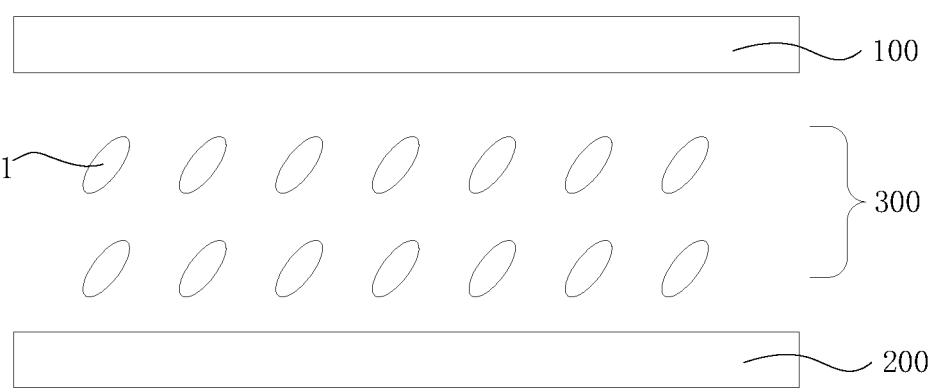
FIG. 8 is a schematic cross-sectional structure diagram of a display panel according to an embodiment of the present disclosure.

Please refer to FIG. 8, which is a schematic cross-sectional structure diagram of a display panel according to an embodiment of the present disclosure. The present disclosure further provides a display panel comprising the aforementioned color filter 100, an array substrate 200, and a liquid crystal layer 300. The array substrate 200 is disposed opposite to the color filter 100. The liquid crystal layer 300 is disposed between the array substrate 200 and the color filter 100. The liquid crystal layer 300 comprises a plurality of liquid crystal molecules 301. A driving voltage is applied to the array substrate 200 and the color filter 100 to control rotation directions of the liquid crystal molecules 301, thereby displaying images.

Beneficial effects of the present invention are as follows. In the color filter, the method for fabricating the same, and the display panel provided by the present disclosure, by controlling process parameters of a curing process of the first photoresists, the density of the cured first photoresists is increased. Therefore, when the second photoresists are subsequently formed, the dye molecules in the second photoresists are not easy to diffuse and penetrate surface of the first photoresists. Accordingly, after the second photoresists are developed, the dye molecules will not remain on the surfaces of the first photoresists, which avoids a decrease in transmittance of the first photoresists. This is beneficial to solve a problem of mutual dyeing of photoresists of different colors.

The present application has been described in the above preferred embodiments, but the preferred embodiments are not intended to limit the scope of the present application. Those skilled in the art may make various changes and modifications without departing from the scope of the present application. The scope of the present application is determined by claims.

What is claimed is:

1. A method for fabricating a color filter, comprising:
providing a substrate;
forming a first photoresist material layer on the substrate;
patterning the first photoresist material layer to form a plurality of first photoresists;
forming a second photoresist material layer on the first photoresists and the substrate, wherein the second photoresist material layer comprises a plurality of dye molecules; and
patterning the second photoresist material layer to form a plurality of second photoresists;
wherein the patterning the first photoresist material layer to form forming the first photoresists comprises:
controlling curing process parameters of the first photoresists to increase a density of the first photoresists, thereby preventing the dye molecules from entering the first photoresists,
wherein each of the first photoresists comprises:
a first photoresist portion disposed on a side of the substrate; and
a second photoresist portion disposed on a side of the first photoresist portion away from the substrate;
wherein a density of the second photoresist portion is greater than a density of the first photoresist portion, so as to prevent the dye molecules from entering the first photoresists; or
wherein each of the first photoresists comprises:
a first photoresist portion disposed on a side of the substrate; and
a third photoresist portion covering the substrate and the first photoresist portion;
wherein a density of the third photoresist portion is greater than a density of the first photoresist portion, so as to prevent the dye molecules from entering the first photoresists.

2. The method for fabricating the color filter according to claim 1, wherein the controlling the curing process parameters of the first photoresists comprises:
providing a first mask;
photo-curing the first photoresist material layer from a side of the first mask away from the substrate;
developing the photo-cured first photoresist material layer; and
heat-curing the developed first photoresist material layer to form the first photoresists;
wherein one or more of an exposure energy value of the photo-curing is adjusted, and/or a temperature of the heat-curing is increased, and/or and a time of the heat-curing are increased, so as to increase the density of the first photoresists, thereby preventing the dye molecules from entering the first photoresists.

3. The method for fabricating the color filter according to claim 2, wherein the exposure energy value is 40 mJ/cm$^2$ to 90 mJ/cm$^2$, the temperature of the heat-curing is 230° C. to 350° C., and the time of the heat-curing is 20 minutes to 90 minutes.

4. The method for fabricating the color filter according to claim 1, wherein the patterning the second photoresist material layer to form forming the second photoresists comprises:
providing a second mask;
photo-curing the second photoresist material layer from a side of the second mask away from the substrate;

developing the photo-cured second photoresist material layer; and heat-curing the developed second photoresist material layer to form the second photoresists.

5. The method for fabricating the color filter according to claim 1, wherein the first photoresists comprise the same dye molecules as the second photoresists.

6. The method for fabricating the color filter according to claim 5, wherein the dye molecules have a particle size of 1 nm to 3 nm.

7. The method for fabricating the color filter according to claim 1, before forming the second photoresists or before forming the first photoresists, further comprising:

forming a plurality of third photoresists, which comprises:

controlling curing process parameters of the third photoresists to increase a density of the third photoresists, thereby preventing the dye molecules from entering the third photoresists.

8. The method for fabricating the color filter according to claim 7, before forming the first photoresists and the second photoresists, further comprising:

forming a black matrix material layer on the substrate; and patterning the black matrix material layer to form a plurality of black matrices spaced apart from each other;

wherein each of the first photoresists, the second photoresists, and the third photoresists is formed between at least two adjacent black matrices.

9. The method for fabricating the color filter according to claim 8, wherein one of the first photoresist, the second photoresist, and the third photoresist is one of a red photoresist, a green photoresist, and a blue photoresist, and the first photoresist, the second photoresist, and the third photoresist have different colors.

10. A color filter, comprising a plurality of first photoresists and a plurality of second photoresists, wherein the second photoresists comprise a plurality of dye molecules, and a density of the first photoresists is greater than a predetermined value, thereby preventing the dye molecules from entering the first photoresists, wherein each of the first photoresists comprises:

a first photoresist portion disposed on a side of the substrate; and a second photoresist portion disposed on a side of the first photoresist portion away from the substrate;

wherein a density of the second photoresist portion is greater than a density of the first photoresist portion, so as to prevent the dye molecules from entering the first photoresists; or wherein each of the first photoresists comprises:

a first photoresist portion disposed on a side of the substrate; and a third photoresist portion covering the substrate and the first photoresist portion;

wherein a density of the third photoresist portion is greater than a density of the first photoresist portion, so as to prevent the dye molecules from entering the first photoresists.

11. The color filter according to claim 10, wherein the first photoresists comprise the same dye molecules as the second photoresists.

12. The color filter according to claim 10, wherein the dye molecules have a particle size of 1 nm to 3 nm.

13. The color filter according to claim 10, further comprising a plurality of third photoresists, wherein one of the first photoresist, the second photoresist, and the third photoresist is one of a red photoresist, a green photoresist, and a blue photoresist, and the first photoresist, the second photoresist, and the third photoresist have different colors.

14. The color filter according to claim 10, further comprising a plurality of black matrices, wherein each of the first photoresists, the second photoresists, and the third photoresists is formed between at least two adjacent black matrices.

15. A display panel, comprising:

a color filter comprising a plurality of first photoresists and a plurality of second photoresists, wherein the second photoresists comprise a plurality of dye molecules, and a density of the first photoresists is greater than a predetermined value, thereby preventing the dye molecules from entering the first photoresists;

an array substrate disposed opposite to the color filter; and a liquid crystal layer disposed between the array substrate and the color filter, wherein each of the first photoresists comprises:

a first photoresist portion disposed on a side of the substrate; and a second photoresist portion disposed on a side of the first photoresist portion away from the substrate;

wherein a density of the second photoresist portion is greater than a density of the first photoresist portion, so as to prevent the dye molecules from entering the first photoresists; or wherein each of the first photoresists comprises:

a first photoresist portion disposed on a side of the substrate; and a third photoresist portion covering the substrate and the first photoresist portion;

wherein a density of the third photoresist portion is greater than a density of the first photoresist portion, so as to prevent the dye molecules from entering the first photoresists.

* * * * *